(12) United States Patent
Owaki et al.

(10) Patent No.: US 9,362,921 B2
(45) Date of Patent: Jun. 7, 2016

(54) OSCILLATOR, ELECTRONIC APPARATUS, AND MOVING OBJECT

(71) Applicant: Seiko Epson Corporation, Tokyo (JP)

(72) Inventors: Takuya Owaki, Minowa-machi (JP); Hideyuki Kanno, Minowa-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/090,233

(22) Filed: Nov. 26, 2013

(65) Prior Publication Data

US 2014/0152392 A1   Jun. 5, 2014

(30) Foreign Application Priority Data

Nov. 30, 2012   (JP) ................ 2012-262120

(51) Int. Cl.
*H03H 9/10*   (2006.01)
*H03L 1/02*   (2006.01)
*H03B 5/32*   (2006.01)
*H03B 1/02*   (2006.01)

(52) U.S. Cl.
CPC .. *H03L 1/02* (2013.01); *H03B 5/32* (2013.01); *H03H 9/10* (2013.01); *H03B 1/02* (2013.01)

(58) Field of Classification Search
CPC ........................................ H03H 9/10

USPC .................... 331/68, 158, 116 R
See application file for complete search history.

(56) References Cited

U.S. PATENT DOCUMENTS

| | | | |
|---|---|---|---|
| 6,664,864 B2 * | 12/2003 | Jiles et al. ............... | 331/176 |
| 7,177,618 B2 * | 2/2007 | Motoyama ................. | 455/323 |
| 7,190,238 B2 * | 3/2007 | Hosokawa et al. .......... | 331/158 |
| 8,860,516 B2 * | 10/2014 | Nishio ...................... | 331/107 A |
| 2003/0107444 A1 * | 6/2003 | Ieki et al. ................. | 331/107 SL |
| 2005/0184626 A1 | 8/2005 | Chiba et al. | |
| 2012/0075026 A1 * | 3/2012 | Ruby et al. ................ | 331/70 |

FOREIGN PATENT DOCUMENTS

JP   2006-050529 A   2/2006
JP   2010-103802 A   5/2010

* cited by examiner

*Primary Examiner* — Joseph Chang
(74) *Attorney, Agent, or Firm* — Harness, Dickey & Pierce, P.L.C.

(57) ABSTRACT

A temperature-compensated piezoelectric oscillator as an oscillator includes a piezoelectric resonator incorporating a resonator element, an electronic component (IC) as a circuit element having a function of driving the resonator element and a thermosensor, and a wiring board provided with a conductor film, and the piezoelectric resonator element and the electronic component (IC) are disposed side by side in an area where the conductor film is disposed.

12 Claims, 6 Drawing Sheets

PROCESS PROCEDURE

| 1 | APPLY SOLDER |
|---|---|
| 2 | MOUNT CHIP C |
| 3 | APPLY ELECTRICALLY-CONDUCTIVE ADHESIVE |
| 4 | MOUNT RESONATOR AND IC |
| 5 | WIRE BONDING |
| 6 | LID SEAL |
| 7 | MARKING |

FIG. 4

OSCILLATOR, ELECTRONIC APPARATUS, AND MOVING OBJECT

BACKGROUND

1. Technical Field

The present invention relates to an oscillator, an electronic apparatus and a moving object each equipped with an oscillator.

2. Related Art

In recent years, an oscillator as an example of an electronic device is used in many fields from communication equipment such as a cellular phone to consumer equipment such as a quartz-crystal clock due to the frequency stability, small size and light weight, robustness, low price, and so on. JP-A-2010-103802 (Document 1) discloses an oscillator which has achieved a surface-mount property. The oscillator of Document 1 is composed of a quartz crystal resonator, an electronic component (IC), a package, and a lid member, wherein the quartz crystal resonator incorporates a resonator element, the electronic component (IC) is a circuit element having a function of driving the resonator element, the package is a container having a recessed section, which has an opening in at least one direction, and houses the quartz crystal resonator and the electronic component (IC), and the lid member having one surface opposed to the opening of the recessed section and connected to the package. Document 1 shows a structure in which the electronic component (IC) is mounted on an upper surface in a plan view of the quartz crystal resonator.

Incidentally, in the oscillator disclosed in Document 1, the electronic component (IC) is mounted on the upper surface of the quartz crystal resonator in the plan view. In such a configuration, it results that the heat from the outside conducted from the outer bottom surface of the package is conducted to the quartz crystal resonator, and then conducted to the electronic component (IC) via the quartz crystal resonator. Therefore, in the case in which the external temperature varies, the temperature of the quartz crystal resonator is varied by the external temperature variation, and then the temperature of the electronic component (IC) is varied. Therefore, since a temperature difference occurs between the quartz crystal resonator and the electronic component (IC), in the case in which a thermosensor is incorporated in the electronic component (IC), the temperature of the quartz crystal resonator is not correctly measured. Therefore, in the case of compensating the frequency of the oscillator based on the temperature measured by the thermosensor, namely a temperature-compensated oscillator, for example, there is a possibility that the frequency compensation accuracy is deteriorated.

SUMMARY

An advantage of some aspects of the invention is to solve at least a part of the problems described above, and the invention can be implemented as the following forms or application examples.

APPLICATION EXAMPLE 1

This application example is directed to an oscillator including a resonator element encapsulated in a first container, a circuit element including a function of driving at least the resonator element, and a wiring board provided with a conductor film, and the first container and the circuit element are disposed side by side in an area where the conductor film is disposed in a plan view.

According to the oscillator described in this application example, the first container encapsulating the resonator element and the circuit element are disposed in the area on the wiring board where the conductor film is disposed. Further, the first container and the circuit element are disposed side by side on the wiring board in the plan view. Since the first container and the circuit element are disposed in such a manner, namely the first container and the circuit element are disposed side by side in the area of the wiring board where the conductor film is disposed, the condition of the thermal conduction from the outside is equalized and at the same time the thermal coupling between the first container and the circuit element is enhanced, and even in the case in which the temperature varies in the outside of the wiring board, the temperature of the resonator element encapsulated in the first container and the temperature of the circuit element become roughly equal to each other. Therefore, the temperature of the resonator element can accurately be measured by the thermosensor existing inside the circuit element. For example, since the temperature-compensated oscillator performs the compensation of the frequency based on the temperature of the resonator element, the more accurately the temperature of the resonator element can be measured, the higher compensation accuracy can be obtained. Therefore, by using the present configuration, the temperature-compensated oscillator having high temperature compensation accuracy, for example, can be provided as the oscillator.

APPLICATION EXAMPLE 2

This application example is directed to the oscillator according to Application Example 1, wherein the first container has at least one surface formed of metal, and the one surface and the conductor film are opposed to each other.

According to this application example, since the surface formed of metal of the first container, namely the surface having electrical conductivity is opposed to the conductive film provided to the wiring board, the thermal coupling between the first container and the circuit element is enhanced, and it results that the state in which the first container and the circuit element are at the same temperature is further approached. Therefore, it becomes possible to provide, for example, the temperature-compensated oscillator with high temperature compensation accuracy as the oscillator.

APPLICATION EXAMPLE 3

This application example is directed to the oscillator according to Application Example 1, wherein the first container and the conductor film are bonded to each other via a bonding member having electrical conductivity.

According to this application example, the first container and the conductor film are bonded to each other with the bonding material having electrical conductivity. In general, since the higher the electrical conductivity is, the higher the thermal conductivity is, the thermal coupling between the first container and the circuit element is enhanced, and it results that the state in which the first container and the circuit element are at the same temperature is further approached. Therefore, it becomes possible to provide, for example, the temperature-compensated oscillator with high temperature compensation accuracy as the oscillator.

APPLICATION EXAMPLE 4

This application example is directed to the oscillator according to Application Example 2, wherein the first container and the conductor film are bonded to each other via a bonding member having electrical conductivity.

According to this application example, the first container and the conductor film are bonded to each other with the bonding material having electrical conductivity. In general, since the higher the electrical conductivity is, the higher the thermal conductivity is, the thermal coupling between the first container and the circuit element is enhanced, and it results that the state in which the first container and the circuit element are at the same temperature is further approached. Therefore, it becomes possible to provide, for example, the temperature-compensated oscillator with high temperature compensation accuracy as the oscillator.

APPLICATION EXAMPLE 5

This application example is directed to the oscillator according to Application Example 1, wherein the first container has an external connection terminal on a surface viewed from a direction of a surface of the wiring board on which the first container is disposed, the external connection terminal being electrically connected to the resonator element, the circuit element has a terminal electrode on a surface viewed from the direction of the surface of the wiring board on which the first container is disposed, and the connection terminal and the terminal electrode are electrically connected to each other.

According to this application example, since the electrical connection terminal between the first container and the circuit element is disposed on the surface (the surface which can be viewed in the plan view, in other words, the upper surface) viewed from the surface of the wiring board on which the first container is disposed, the thermal coupling and the electrical connection between the first container and the circuit element can separately be achieved. Therefore, since the arrangement with the thermal coupling enhanced can be adopted irrespective of the state of the electrical connection between the first container and the circuit element, it becomes possible to provide, for example, the temperature-compensated oscillator with high temperature compensation accuracy as the oscillator.

APPLICATION EXAMPLE 6

This application example is directed to the oscillator according to Application Example 2, wherein the first container has an external connection terminal on a surface viewed from a direction of a surface of the wiring board on which the first container is disposed, the external connection terminal being electrically connected to the resonator element, the circuit element has a terminal electrode on a surface viewed from the direction of the surface of the wiring board on which the first container is disposed, and the connection terminal and the terminal electrode are electrically connected to each other.

According to this application example, since the electrical connection terminal between the first container and the circuit element is disposed on the surface (the surface which can be viewed in the plan view, in other words, the upper surface) viewed from the surface of the wiring board on which the first container is disposed, the thermal coupling and the electrical connection between the first container and the circuit element can separately be achieved. Therefore, since the arrangement with the thermal coupling enhanced can be adopted irrespective of the state of the electrical connection between the first container and the circuit element, it becomes possible to provide, for example, the temperature-compensated oscillator with high temperature compensation accuracy as the oscillator.

APPLICATION EXAMPLE 7

This application example is directed to the oscillator according to Application Example 3, wherein the first container has an external connection terminal on a surface viewed from a direction of a surface of the wiring board on which the first container is disposed, the external connection terminal being electrically connected to the resonator element, the circuit element has a terminal electrode on a surface viewed from the direction of the surface of the wiring board on which the first container is disposed, and the connection terminal and the terminal electrode are electrically connected to each other.

According to this application example, since the electrical connection terminal between the first container and the circuit element is disposed on the surface (the surface which can be viewed in the plan view, in other words, the upper surface) viewed from the surface of the wiring board on which the first container is disposed, the thermal coupling and the electrical connection between the first container and the circuit element can separately be achieved. Therefore, since the arrangement with the thermal coupling enhanced can be adopted irrespective of the state of the electrical connection between the first container and the circuit element, it becomes possible to provide, for example, the temperature-compensated oscillator with high temperature compensation accuracy as the oscillator.

APPLICATION EXAMPLE 8

This application example is directed to the oscillator according to Application Example 4, wherein the first container has an external connection terminal on a surface viewed from a direction of a surface of the wiring board on which the first container is disposed, the external connection terminal being electrically connected to the resonator element, the circuit element has a terminal electrode on a surface viewed from the direction of the surface of the wiring board on which the first container is disposed, and the connection terminal and the terminal electrode are electrically connected to each other.

According to this application example, since the electrical connection terminal between the first container and the circuit element is disposed on the surface (the surface which can be viewed in the plan view, in other words, the upper surface) viewed from the surface of the wiring board on which the first container is disposed, the thermal coupling and the electrical connection between the first container and the circuit element can separately be achieved. Therefore, since the arrangement with the thermal coupling enhanced can be adopted irrespective of the state of the electrical connection between the first container and the circuit element, it becomes possible to provide, for example, the temperature-compensated oscillator with high temperature compensation accuracy as the oscillator.

APPLICATION EXAMPLE 9

This application example is directed to an electronic apparatus including the oscillator according to Application Example 1.

According to the electronic apparatus described in this application example, since the temperature-compensated oscillator with high temperature compensation accuracy, for example, is used as the oscillator, it becomes possible to keep the accurate electrical characteristics also in the electronic apparatus.

APPLICATION EXAMPLE 10

This application example is directed to an electronic apparatus including the oscillator according to Application Example 2.

According to the electronic apparatus described in this application example, since the temperature-compensated oscillator with high temperature compensation accuracy, for example, is used as the oscillator, it becomes possible to keep the accurate electrical characteristics also in the electronic apparatus.

APPLICATION EXAMPLE 11

This application example is directed to an electronic apparatus including the oscillator according to Application Example 3.

According to the electronic apparatus described in this application example, since the temperature-compensated oscillator with high temperature compensation accuracy, for example, is used as the oscillator, it becomes possible to keep the accurate electrical characteristics also in the electronic apparatus.

APPLICATION EXAMPLE 12

This application example is directed to a moving object including the oscillator according to Application Example 1.

According to the moving object described in this application example, since the temperature-compensated oscillator with high temperature compensation accuracy, for example, is used as the oscillator, it becomes possible to keep the accurate electrical characteristics also in the moving object.

APPLICATION EXAMPLE 13

This application example is directed to a moving object including the oscillator according to Application Example 2.

According to the moving object described in this application example, since the temperature-compensated oscillator with high temperature compensation accuracy, for example, is used as the oscillator, it becomes possible to keep the accurate electrical characteristics also in the moving object.

APPLICATION EXAMPLE 14

This application example is directed to a moving object including the oscillator according to Application Example 3.

According to the moving object described in this application example, since the temperature-compensated oscillator with high temperature compensation accuracy, for example, is used as the oscillator, it becomes possible to keep the accurate electrical characteristics also in the moving object.

BRIEF DESCRIPTION OF THE DRAWINGS

The invention will be described with reference to the accompanying drawings, wherein like numbers reference like elements.

FIGS. 1A and 1B are schematic diagrams showing a structure of a piezoelectric oscillator according to a first embodiment of the invention, wherein FIG. 1A is a plan view, and FIG. 1B is a cross-sectional view along the arrows Q-Q'.

FIGS. 2A and 2B are schematic diagrams showing an external configuration of the piezoelectric oscillator according to the embodiment, wherein FIG. 2A is a front view, and FIG. 2B is a bottom view.

FIG. 4 is a process procedure chart of the piezoelectric oscillator according to the first embodiment.

DESCRIPTION OF EXEMPLARY EMBODIMENTS

Some embodiments of the invention will hereinafter be explained in detail with reference to the accompanying drawings.

Figure 1A:
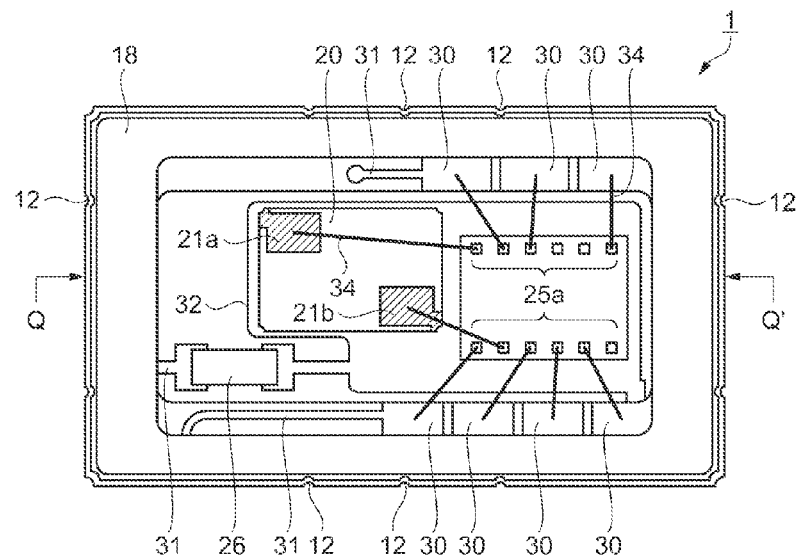
Figure 1B:
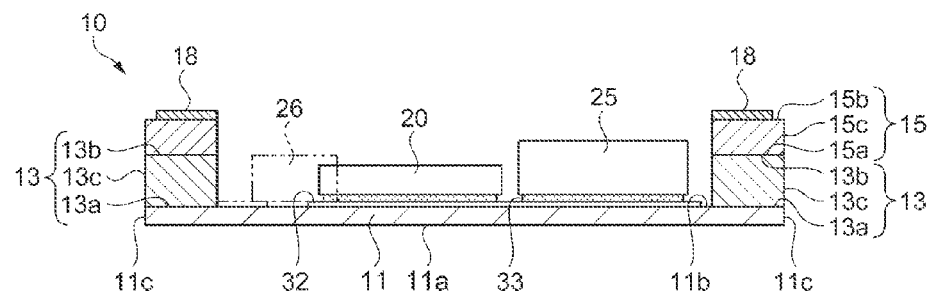
Figure 2A:
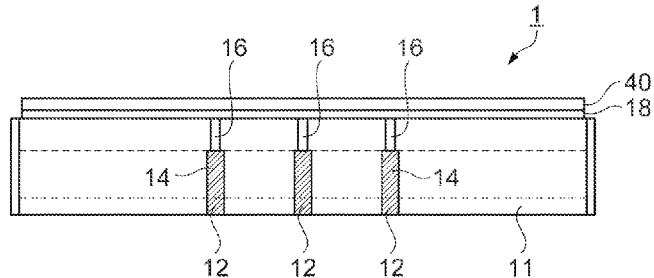
Figure 2B:
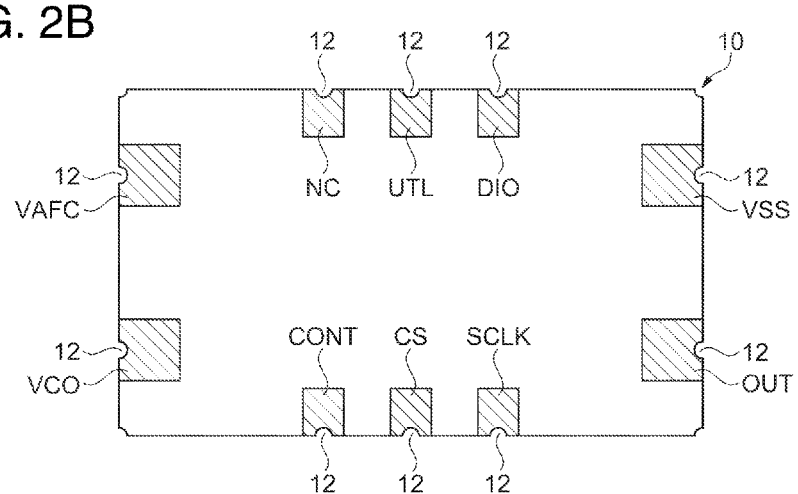

FIGS. 1A and 1B are schematic diagrams showing an internal configuration of a piezoelectric oscillator according to an embodiment of the invention, wherein FIG. 1A is a plan view, and FIG. 1B is a cross-sectional view along the arrows Q-Q' shown in FIG. 1A. Further, FIGS. 2A and 2B are schematic diagrams showing an external configuration of the piezoelectric oscillator according to the present embodiment, wherein FIG. 2A is a front view, and FIG. 2B is a bottom view.

A temperature-compensated piezoelectric oscillator 1 as an example of the piezoelectric oscillator according to the present embodiment is provided with a laminated ceramic package (hereinafter simply referred to as a "package") 10 formed by stacking ceramics as an airtight container, which is a second container. The package 10 is composed of a substrate (a wiring board) 11, a first frame-shaped side wall 13, and a second frame-shaped side wall 15, wherein the first frame-shaped side wall 13 is bonded on the substrate 11, and the second frame-shaped side wall 15 is bonded on the first frame-shaped side wall 13. A seal ring 18 made of metal (kovar material) is bonded to an upper surface 15b of the second frame-shaped side wall 15.

The substrate 11 is composed of a lower surface 11a as a first principal surface, an upper surface 11b as a second principal surface, and a plate-like ceramic having a side surface 11c continuous with the lower surface 11a and the upper surface 11b. The side surface 11c of the substrate 11 is provided with castellations (first notches) 12 each extending from the lower surface 11a to the upper surface 11b.

The first frame-shaped side wall 13 is composed of a lower surface 13a and a side surface 13c continuous with an upper surface 13b, and is disposed on the substrate 11. The side surface 13c of the first frame-shaped side wall 13 is provided with castellations (first notches) 14 each extending from the lower surface 13a to the upper surface 13b.

The second frame-shaped side wall 15 is also composed of a lower surface 15a and a side surface 15c continuous with the upper surface 15b, and is disposed on the first frame-shaped side wall 13. The side surface 15c of the second frame-shaped side wall 15 is provided with castellations (second notches) 16 each extending from the lower surface 15a to the upper surface 15b.

In the inside (space), which is the recessed section having the opening in one direction of the package 10, there are housed a piezoelectric resonator 20 formed by packaging the resonator element (not shown) and a variety of electronic components 25, 26, and the piezoelectric resonator 20 and the variety of electronic components 25, 26 constitute, for example, a temperature-compensated piezoelectric oscillator. The piezoelectric resonator 20 and the electronic component 25 are disposed in the recessed section side by side in a plan view (viewed from the opening side).

The piezoelectric resonator 20 is obtained by housing the piezoelectric resonator element (a resonator element) not shown in a recessed section of a package made of ceramic having a concave shape as a first container, then filling the inside of the recessed section with an inert gas ($N_2$), then covering the recessed section with a lid member made of metal not shown such as a kovar material, and then airtightly sealing the lid member, and is mounted on a conductive film 32 existing in the recessed section of the package 10 via an electrically-conductive adhesive 33 with the metal lid member side opposed to the conductive film 32. It should be noted that the inside of the piezoelectric resonator 20 can also be filled with another inert gas, or can also be set to a vacuum state.

Further, external connection terminals 21a, 21b are formed on the upper surface of the package of the piezoelectric resonator 20. It should be noted that the upper surface of the package of the piezoelectric resonator 20 denotes a surface on the side, which can be visually recognized when viewing the piezoelectric resonator 20 mounted on the package 10 from the direction of a lid member 40 of the package 10. In other words, the upper surface of the package of the piezoelectric resonator 20 is a surface on an opposite side to the side to which the lid member covering the recessed section of the package of the piezoelectric resonator 20 is connected.

The electronic component 26 is, for example, a chip capacitor or the like, and is mounted on a wiring conductor 31 in the package 10 via, for example, solder.

The electronic component 25 as a circuit element is an IC incorporating, for example, an oscillator circuit, a temperature sensor as a thermosensor, a variable capacitance element, and a temperature compensation circuit. Further, the electronic component 25 is mounted on the conductive film 32 via an electrically-conductive adhesive 33 in a state of being arranged side by side with the piezoelectric resonator 20, wherein the conductive film 32 exists in the recessed section of the package 10.

In an upper surface peripheral portion of the electronic component 25, there are formed a plurality of terminal electrodes 25a, 25a, . . . , and one of the terminal electrodes 25a is connected to the external connection terminal 21a with a bonding wire 34, and another of the terminal electrodes 25a is connected to the external connection terminal 21b with another bonding wire 34. Further, the rest of the terminal electrodes 25a are connected to pad electrodes 30 with bonding wires 34, respectively, the pad electrodes 30 being formed in a stepped portion of the package 10, namely on the upper surface 13b of the first frame-shaped side wall 13. It should be noted that the upper surface of the electronic component 25 denotes a surface on the side, which can visually be viewed from the direction of the lid member 40.

The pad electrodes 30 are electrically connected to terminal electrodes VSS, VCO, CONT, OUT, and so on disposed on a bottom surface of the package 10 shown in FIG. 2B via the wiring conductors 31, internal conductors not shown, and the castellations 12, 14, respectively.

The lid member 40 made of metal (the kovar material) not shown is seam welded to the seal ring 18 formed on the upper surface of the package 10. On this occasion, an inert gas (a nitrogen gas $N_2$) is encapsulated inside the package 10 so as to suppress the aging of the electronic components 25, 26, wiring conductors, the terminal electrodes, and so on. It should be noted that the inside of the package 10 can also be filled with another inert gas, or can also be set to a vacuum state.

In the temperature-compensated piezoelectric oscillator 1 configured as described above, it is configured so as to be durable against long term use of, for example, 10 through 20 years by being equipped with the piezoelectric resonator 20 having the piezoelectric resonator element packaged (airtightly sealed) in the space of the package 10 for achieving the airtight sealing in an inert gas atmosphere or in a vacuum.

Further, in the temperature-compensated piezoelectric oscillator 1 according to the present embodiment, in order to ensure the internal space (the recessed section having the opening on the side where the lid member 40 is disposed) of the package 10 without increasing the size of the temperature-compensated piezoelectric oscillator 1, the depth (the radius if a semicylindrical shape is adopted) of the castellations 12, 14 provided to the substrate 11 and the first frame-shaped side wall 13 and the depth of the castellations 16 provided to the second frame-shaped side wall 15 are made different from each other as shown in the side view of FIG. 2A. Specifically, in the present embodiment, by making the depth of the castellations 16 of the second frame-shaped side wall 15 having the smallest wall thickness shallower than that of the castellations 12, 14 provided to the substrate 11 and the first frame-shaped side wall 13, it is arranged that the internal space (the internal capacity) of the package 10 is increased while keeping the second frame-shaped side wall 15 with the wall thickness having the sufficient strength. Thus, it becomes possible to install the piezoelectric resonator 20 thus packaged in the package 10 without growing the package 10 of the temperature-compensated piezoelectric oscillator 1 in size. In other words, it becomes possible to realize the temperature-compensated piezoelectric oscillator 1, which is small in size, and is capable of maintaining the electrical characteristics for a long period of time.

Figure 3:
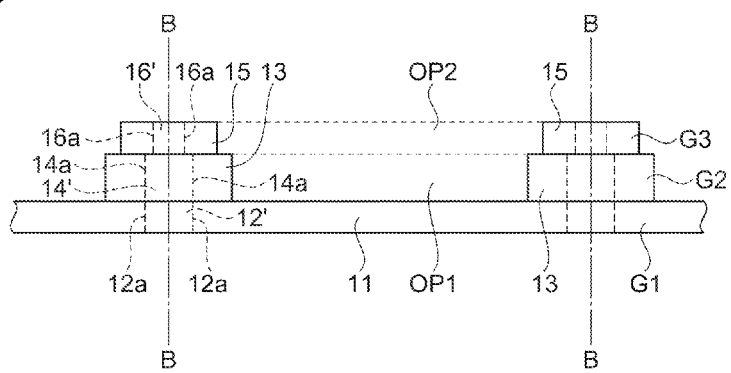
FIG. 3 is a cross-sectional view of a laminated green sheet before being divided into packages.

FIG. 3 is a cross-sectional diagram showing a process of forming the laminated sheet for the package of the piezoelectric oscillator according to the present embodiment. In this case, a green sheet G2 (which forms the first frame-shaped side wall 13) is stacked on a green sheet G1 (which forms the substrate 11), then a green sheet G3 (which forms the second frame-shaped side wall 15) is further stacked thereon, and then calcination is performed thereon, wherein the green sheet G1 is provided with a plurality of holes 12' each having a predetermined size, the green sheet G2 is provided with a plurality of holes 14' each having a predetermined size and an opening section OP1, and the green sheet G3 is provided with a plurality of holes 16' each having a predetermined size and an opening section OP2. On this occasion, the holes 12' of the green sheet G1 and the holes 14' of the green sheet G2 are arranged to penetrate the respective green sheets in a state in which a conductive material is applied to the inner wall surfaces 12a, 14a thereof. Such a structure can be formed by filling the holes 12', 14' of the green sheets G1, G2 with the conductive material, and then sucking the conductive material in the holes 12', 14'.

Then, by circulating a coating liquid through the holes 12', 14', and 16', it is possible to perform coating on the conductive material on the desired inner surfaces 12a, 14a, and 16a.

Therefore, by subsequently dividing the green sheets G1, G2, and G3 stacked on each other at the lines B-B, the ceramic packages 10 provided with the castellations 12, 14, and 16 can be obtained. As an example, in the case in which the hole 12' has a cylindrical shape, the diameter thereof is 0.15 mm, and the diameter of the hole 16' is in a range from 0.08 mm to 0.1 mm.

As described above, by appropriately selecting the sizes of the holes 12', 14', and 16', it is possible to set the depths of the castellations 12, 14, and 16 to desired values.

Further, it is also possible to provide the coating of the castellations 16 to a predetermined position (height), and there is also an advantage that the short circuit between the lid member 40 and the castellations 16 can be prevented in the case of seam welding the lid member 40 to the seal ring 18 of the package 10.

Further, as the shape of the holes 12', 14' and 16', although the cylindrical shape is adopted commonly, an elliptical shape or a rectangular shape can also be adopted.

In the present embodiment, since the sizes of the holes 12', 14' are made equal to each other, and the size of the holes 16' is made smaller than the sizes of the holes 12', 14', the castellations 12, 14 are equal in depth to each other, and the depth of the castellations 16 becomes shallower than the depth of the castellations 12, 14 in this case. Further, in the case of setting the sizes of the holes 14', 16' to be equal to each other, and smaller than the size of the hole 12', it becomes that the castellations 14, 16 are equal in depth to each other, and shallower in depth than the castellations 12.

In either of the cases, it is important that the depth of the castellations 12 is set to be roughly equal to the depth in the related art package to thereby keep the level with which the bonding strength with the mounting board can be maintained. Further, it is important for the depth of the castellations 16, or the depth of the castellations 14, 16 to be kept at a level with which the strength of the package 10 can be maintained in roughly the same level as in the related art.

It should be noted that although in the present embodiment the explanation is presented citing as an example the case in which the number of green sheets to be stacked on each other is three, the number is not required to be limited to three, but can be a number suitable for the desired package.

As described above, in the present embodiment, since the depth of the castellations 12 of the side surface 11c of the substrate 11, or the depth of the castellations 12 of the side surface 11c of the substrate 11 and the castellations 14 of the side surface 13c of the first frame-shaped side wall 13 can be made deeper, the bonding strength with the mounting board can be maintained.

Further, in the embodiment, since depth of the castellations 16 of the side surface 15c of the second frame-shaped side wall 15 can be made shallower than that of the castellations 12, 14, it is possible to miniaturize the temperature-compensated piezoelectric oscillator 1 while ensuring the strength of the package 10.

In the present embodiment, the piezoelectric resonator 20 and the electronic component 25 are arranged on the conductor film 32 existing in the recessed section of the package 10 side by side in the plan view, and are mounted via the electrically-conductive adhesive 33. Therefore, the condition of the heat conduction from the outside of the package 10 is equalized, and at the same time, the thermal coupling between the piezoelectric resonator 20 and the electronic component 25 is enhanced via the conductor film 32 and the electrically-conductive adhesive 33. In addition, since the piezoelectric resonator 20 is mounted on the package 10 via the electrically-conductive adhesive 33 with the metal lid member not shown of the piezoelectric resonator 20 and the conductor film 32 opposed to each other, the thermal coupling between the piezoelectric resonator 20 and the electronic component 25 is further enhanced. Therefore, the temperature measured by the temperature sensor incorporated in the electronic component 25 becomes roughly equal to the temperature of the piezoelectric resonator 20. Therefore, it becomes possible to perform accurate measurement of the piezoelectric resonator 20, and to improve the temperature compensation accuracy of the temperature-compensated piezoelectric oscillator 1.

Further, by configuring the electronic device having the space of the package 10 encapsulating the inert gas therein and then airtightly sealed with the lid member 40, there is an advantage that the aging of the electronic components, the connection conductors, the electrode terminals, and so on housed in the laminated ceramic package is improved, and thus the electronic device durable against long term use of 10 through 20 years can be configured.

Then, a method of manufacturing the temperature-compensated piezoelectric oscillator according to the first embodiment will be explained with reference to FIGS. 4, 1A, and 1B.

Firstly, the package 10 made of laminated ceramic and provided with the pad electrodes 30, the wiring conductors 31, the conductor film 32, the castellations 12, 14, and 16, and so on is prepared.

Firstly, as a first step, solder is applied on the wiring conductor 31 for the capacitor of the package 10 shown in FIGS. 1A and 1B using a dispenser.

Then, as a second step, the capacitor (the chip capacitor) 26 is mounted on the solder using a mounting device, and is then fed through a reflow device having a predetermined temperature distribution to thereby fix the chip capacitor 26 with the solder.

Subsequently, as a third step, the electrically-conductive adhesive 33 is applied to the conductor film 32 for mounting the piezoelectric resonator 20 and the electronic component 25 using a dispenser or the like.

Then, as a fourth step, the piezoelectric resonator and the electronic component 25 are mounted on the electrically-conductive adhesive 33, and then the electrically-conductive adhesive 33 is dried to cure at a predetermined temperature (e.g., 150° C. for 0.5 H).

Subsequently, as a fifth step, the external connection terminals 21a, 21b of the piezoelectric resonator 20 and the terminal electrodes 25a on the IC 25 are connected to each other with the bonding wires 34, respectively. Further, the predetermined terminal electrodes 25a on the IC 25 and the pad electrodes 30 of the package 10 are connected to each other with the bonding wires 34, respectively.

Then, as a sixth step, the lid member 40 made of metal is welded to the seal ring 18 of the package 10 using a seam welder (a LID seal). After the welding process, the airtightness is checked.

Subsequently, as a seventh step, a predetermined display is carved on the lid member 40 with a laser. The piezoelectric oscillator according to the embodiment of the invention is completed through the process described above.

By adopting such a method of manufacturing the piezoelectric oscillator as described above, it becomes possible to manufacture the temperature-compensated piezoelectric oscillator 1 small in size, and having the electrical characteristics durable for 10 through 20 years.

Although in the above description, the explanation is presented citing the temperature-compensated oscillator using the piezoelectric resonator element as the resonator element as an example, the invention is not limited to the example, but the resonator element can also be an electromechanical resonator such as an MEMS resonator. Further, as the piezoelectric resonator element, any resonator element using a piezoelectric material such as a quartz crystal resonator, an SAW resonator, or a piezoelectric thin film resonator can sufficiently be adopted.

Electronic Apparatus

Then, the electronic apparatuses to which the temperature-compensated piezoelectric oscillator 1 as the temperature-compensated oscillator according to the embodiment of the invention will be explained in detail with reference to FIGS. 5 through 7. It should be noted that in the explanation, an example of applying the temperature-compensated piezoelectric oscillator 1 is described.

Figure 5:
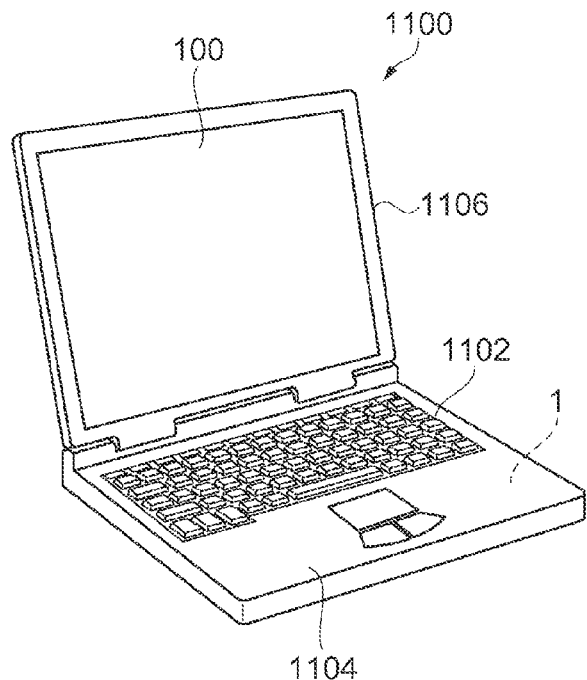
FIG. 5 is a perspective view showing a configuration of a mobile personal computer as an example of the electronic apparatus.

FIG. 5 is a perspective view showing a schematic configuration of a mobile type (or a laptop type) personal computer as the electronic apparatus equipped with the temperature-compensated piezoelectric oscillator 1 according to the embodiment of the invention. In the drawing, the personal computer 1100 includes a main body section 1104 provided with a keyboard 1102, and a display unit 1106 provided with a display section 100, and the display unit 1106 is pivotally supported with respect to the main body section 1104 via a hinge structure. Such a personal computer 1100 incorporates the temperature-compensated piezoelectric oscillator 1 as a reference signal source or the like.

Figure 6:
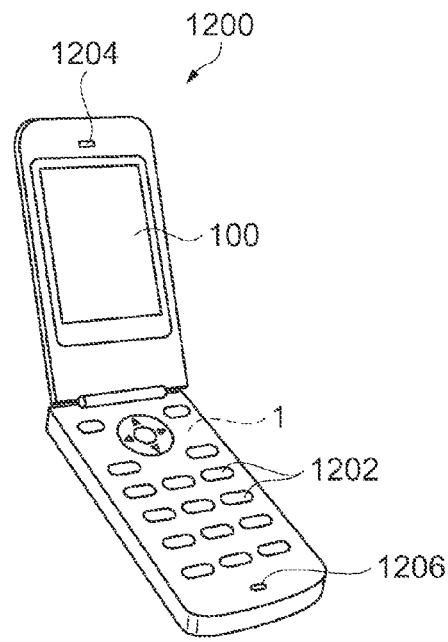
FIG. 6 is a perspective view showing a configuration of a cellular phone as an example of the electronic apparatus.

FIG. 6 is a perspective view showing a schematic configuration of a cellular phone (including PHS) as the electronic apparatus equipped with the temperature-compensated piezoelectric oscillator 1 according to the embodiment of the invention. In this drawing, the cellular phone 1200 is provided with a plurality of operation buttons 1202, an ear piece 1204, and a mouthpiece 1206, and a display section 100 is disposed between the operation buttons 1202 and the ear piece 1204. Such a cellular phone 1200 incorporates the temperature-compensated piezoelectric oscillator 1 as a reference signal source or the like.

Figure 7:
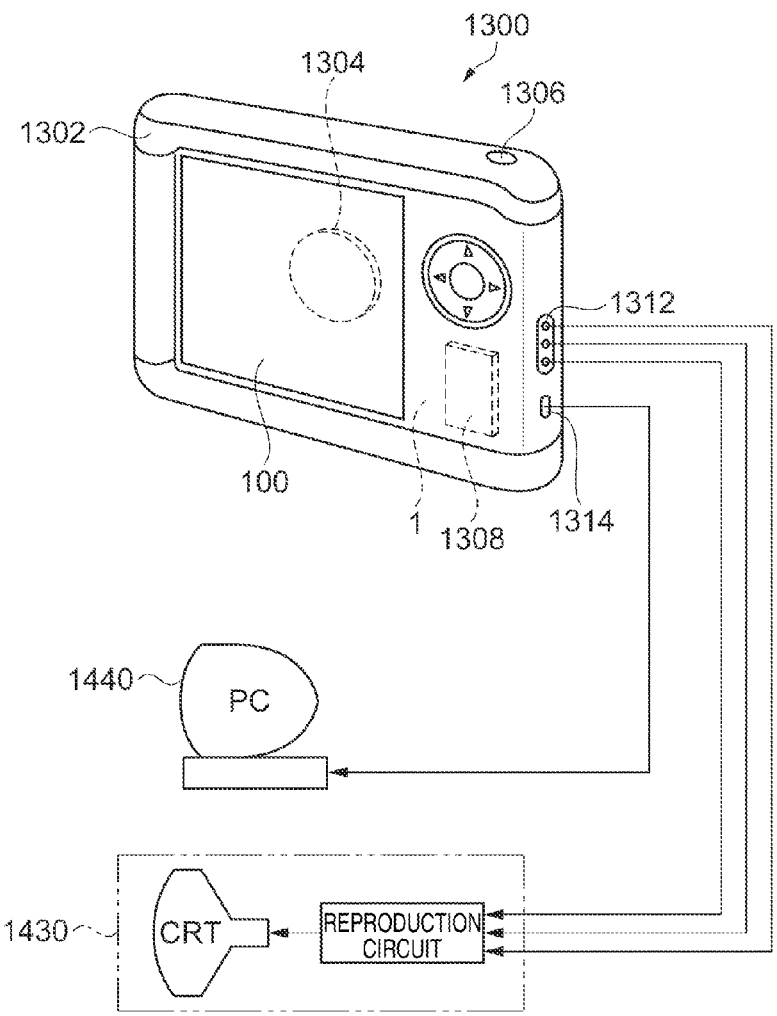
FIG. 7 is a perspective view showing a configuration of a digital still camera as an example of the electronic apparatus.

FIG. 7 is a perspective view showing a schematic configuration of a digital still camera as the electronic apparatus equipped with the temperature-compensated piezoelectric oscillator 1 according to the embodiment of the invention. It should be noted that the connection with external equipment is also shown briefly in this drawing. Here, conventional cameras expose a silver salt film to an optical image of an object, while the digital still camera 1300 performs photoelectric conversion on an optical image of an object by an imaging element such as a CCD (a charge coupled device) to generate an imaging signal (an image signal).

A case (a body) 1302 of the digital still camera 1300 is provided with a display section 100 disposed on the back surface thereof to have a configuration of performing display in accordance with the imaging signal from the CCD, wherein the display section 100 functions as a viewfinder for displaying the object as an electronic image. Further, the front surface (the back side in the drawing) of the case 1302 is provided with a light receiving unit 1304 including an optical lens (an imaging optical system), the CCD, and so on.

When the photographer checks an object image displayed on the display section 100, and then holds down a shutter button 1306, the imaging signal from the CCD at that moment is transferred to and stored in the memory device 1308. Further, the digital still camera 1300 is provided with video signal output terminals 1312 and an input-output terminal 1314 for data communication disposed on a side surface of the case 1302. Further, as shown in the drawing, a television monitor 1430 and a personal computer 1440 are respectively connected to the video signal output terminals 1312 and the input-output terminal 1314 for data communication according to needs. Further, there is adopted the configuration in which the imaging signal stored in the memory device 1308 is output to the television monitor 1430 and the personal computer 1440 in accordance with a predetermined operation. Such a digital still camera 1300 incorporates the temperature-compensated piezoelectric oscillator 1 as a reference signal source or the like.

It should be noted that, the temperature-compensated piezoelectric oscillator 1 according to the embodiment of the invention can also be applied to an electronic apparatus such as an inkjet ejection device (e.g., an inkjet printer), a laptop personal computer, a television set, a video camera, a video recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator besides the personal computer (the mobile personal computer) shown in FIG. 5, the cellular phone shown in FIG. 6, and the digital still camera shown in FIG. 7.

Moving Object

Figure 8:
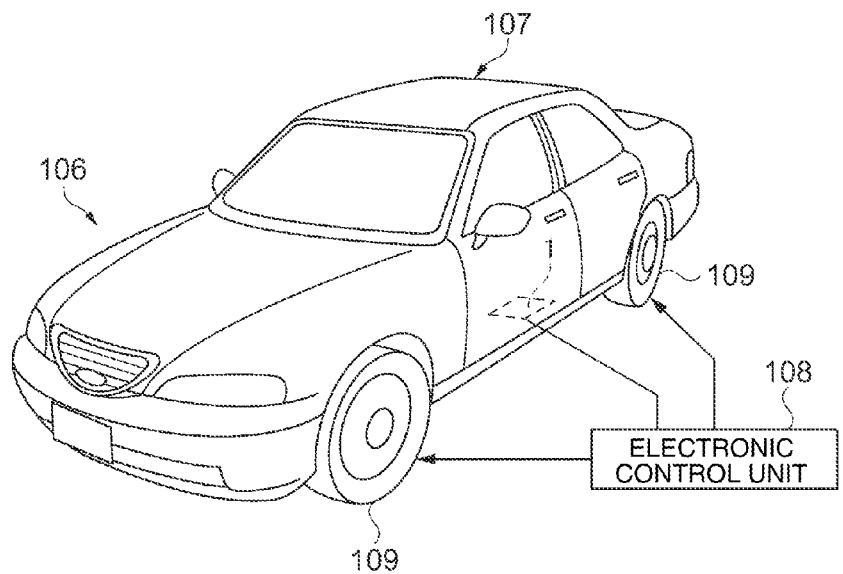
FIG. 8 is a perspective view showing a configuration of a vehicle as an example of the moving object.

FIG. 8 is a perspective view schematically showing a vehicle as an example of the moving object. The vehicle 106 is equipped with the temperature-compensated piezoelectric oscillator 1 according to the embodiment of the invention. For example, as shown in the drawing, in the vehicle 106 as the moving object, an electronic control unit 108 incorporating the temperature-compensated piezoelectric oscillator 1 and for controlling tires 109 and so on is installed in a vehicle body 107.

The entire disclosure of Japanese Patent Application No. 2012-262120, filed Nov. 30, 2012 is expressly incorporated by reference herein.

What is claimed is:
1. An oscillator comprising:
a resonator element;
a circuit element including a function of driving at least the resonator element, and a thermosensor;
a wiring board provided with a conductor film; and
a first container having the resonator element mounted therein,
wherein, when viewing a surface of the wiring board on which the first container is disposed, the first container has an external connection terminal on a surface thereof, and the external connection terminal is electrically connected to the resonator element,
when viewing the surface of the wiring board on which the first container is disposed, the circuit element has a terminal electrode on a surface thereof, and
the external connection terminal and the terminal electrode are electrically connected to each other, and
the resonator element and the circuit element are disposed side by side in a non-overlapping manner in an area where the conductor film is disposed in a plan view.

2. The oscillator according to claim 1, further comprising a first container having the resonator element mounted therein, the first container having at least one surface formed of metal, and the one surface and the conductor film are opposed to each other.

3. The oscillator according to claim 1, further comprising a first container having the resonator element mounted therein, wherein the first container and the conductor film are bonded to each other via a bonding member having electrical conductivity.

4. The oscillator according to claim 2, wherein the first container and the conductor film are bonded to each other via a bonding member having electrical conductivity.

5. An electronic apparatus comprising:
the oscillator according to claim 1.

6. An electronic apparatus comprising:
the oscillator according to claim 2.

7. An electronic apparatus comprising:
the oscillator according to claim 3.

8. A moving object comprising:
the oscillator according to claim 1.

9. A moving object comprising:
the oscillator according to claim 2.

10. A moving object comprising:
the oscillator according to claim 3.

11. The oscillator according to claim 1, wherein the external connection terminal and the terminal electrode are electrically connected to each other via a wire that is separate and apart from the conductor film.

12. The oscillator according to claim 1, wherein the resonator element and the circuit element are disposed side by side in the non-overlapping manner in the area where the conductor film is disposed in the plan view such that an entirety of the each of the resonator element and the circuit element are overlapped by the conductor film.

* * * * *